(12) United States Patent
Kobayashi

(10) Patent No.: US 8,766,533 B2
(45) Date of Patent: Jul. 1, 2014

(54) DISPLAY DEVICE

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 378 days.

(21) Appl. No.: 12/967,402

(22) Filed: Dec. 14, 2010

(65) Prior Publication Data

US 2011/0148944 A1 Jun. 23, 2011

(30) Foreign Application Priority Data

Dec. 18, 2009 (JP) .................................. 2009-287303

(51) Int. Cl.
*H01J 1/62* (2006.01)
*H01J 63/04* (2006.01)

(52) U.S. Cl.
USPC .......................................... 313/505; 313/512

(58) Field of Classification Search
USPC ................. 313/504, 505, 512, 498, 499, 500; 345/690

See application file for complete search history.

(56) References Cited

U.S. PATENT DOCUMENTS

| | | | |
|---|---|---|---|
| 6,998,772 B2 * | 2/2006 | Terumoto | 313/504 |
| 7,453,426 B2 | 11/2008 | Yamazaki | |
| 7,679,283 B2 | 3/2010 | Nimura | |
| 7,750,552 B2 * | 7/2010 | Yamazaki et al. | 313/503 |
| 2004/0227159 A1* | 11/2004 | Nakashima et al. | 257/202 |
| 2004/0245531 A1* | 12/2004 | Fuii et al. | 257/88 |
| 2005/0151830 A1* | 7/2005 | Yamazaki | 347/238 |
| 2006/0066229 A1* | 3/2006 | Nimura | 313/506 |
| 2006/0267490 A1* | 11/2006 | Hong et al. | 313/506 |
| 2009/0073093 A1 | 3/2009 | Yamazaki | |
| 2009/0103304 A1* | 4/2009 | Kobayashi | 362/293 |
| 2009/0236971 A1 | 9/2009 | Kuo et al. | |

FOREIGN PATENT DOCUMENTS

| | | |
|---|---|---|
| JP | A-2000-58260 | 2/2000 |
| JP | A-2000-333211 | 11/2000 |
| JP | A-2001-332392 | 11/2001 |
| JP | A-2002-252089 | 9/2002 |
| JP | A-2005-227762 | 8/2005 |
| JP | A-2006-128077 | 5/2006 |
| JP | A-2009-230107 | 10/2009 |

* cited by examiner

*Primary Examiner* — Nimeshkumar Patel
*Assistant Examiner* — Glenn Zimmerman
(74) *Attorney, Agent, or Firm* — Oliff PLC

(57) ABSTRACT

A display device includes a light emitting functional layer disposed between a first and second substrates; a first pixel which emits light to the second substrate and has a first pixel electrode disposed between the light emitting functional layer and the first substrate, a second electrode disposed between the light emitting functional layer and the second substrate, and a first reflecting layer disposed between the first pixel electrode and the first substrate; a second pixel which emits light to the first substrate side and has a second pixel electrode disposed between the light emitting functional layer and the first substrate, a second electrode disposed between the light emitting functional layer and the second substrate, and a second reflecting layer disposed between the second electrode and the second substrate; and a driving element which drives the first and second pixel electrodes is disposed above first substrate.

12 Claims, 11 Drawing Sheets

FIG. 2A

| 41 | 42 | 43 | 41 | 42 | 43 | 41 | 42 |
|----|----|----|----|----|----|----|----|
| 41 | 42 | 43 | 41 | 42 | 43 | 41 | 42 |
| 41 | 42 | 43 | 41 | 42 | 43 | 41 | 42 |
| 41 | 42 | 43 | 41 | 42 | 43 | 41 | 42 |
| 41 | 42 | 43 | 41 | 42 | 43 | 41 | 42 |

| 41 | 43 | 42 | 41 | 43 | 42 | 41 | 43 |
|----|----|----|----|----|----|----|----|
| 42 | 41 | 43 | 42 | 41 | 43 | 42 | 41 |
| 43 | 42 | 41 | 43 | 42 | 41 | 43 | 42 |
| 41 | 43 | 42 | 41 | 43 | 42 | 41 | 43 |
| 42 | 41 | 43 | 42 | 41 | 43 | 42 | 41 |

100

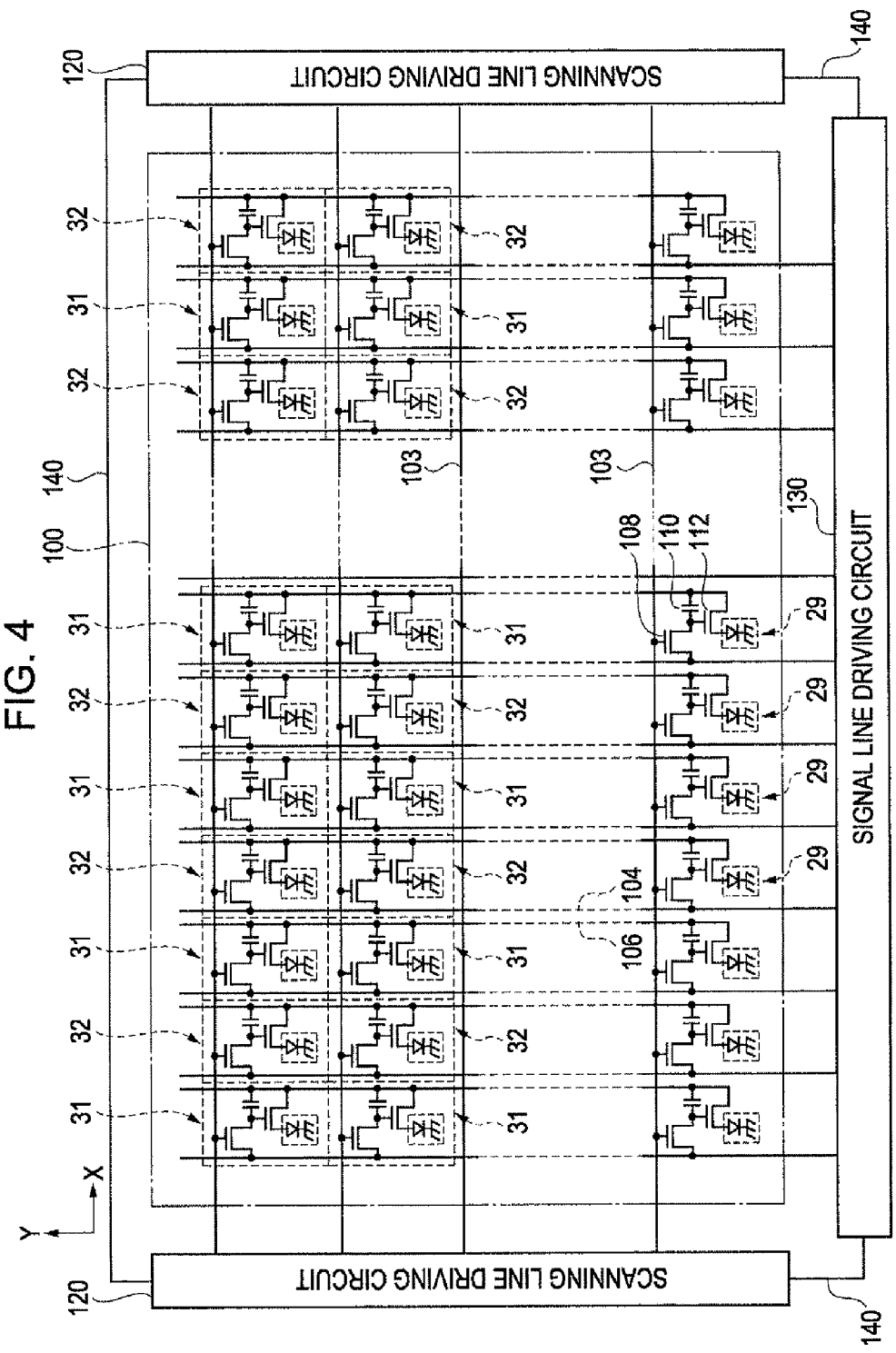

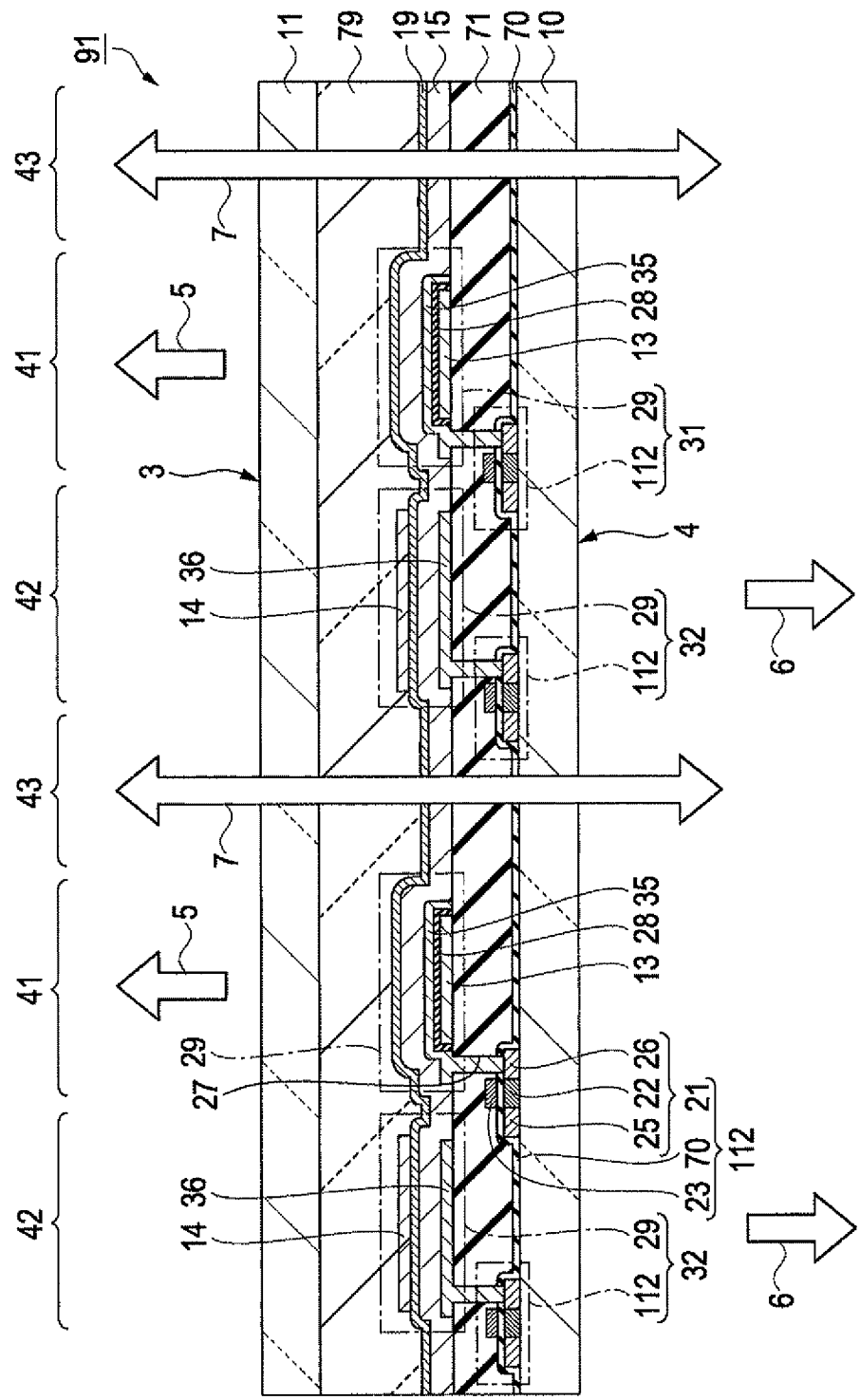

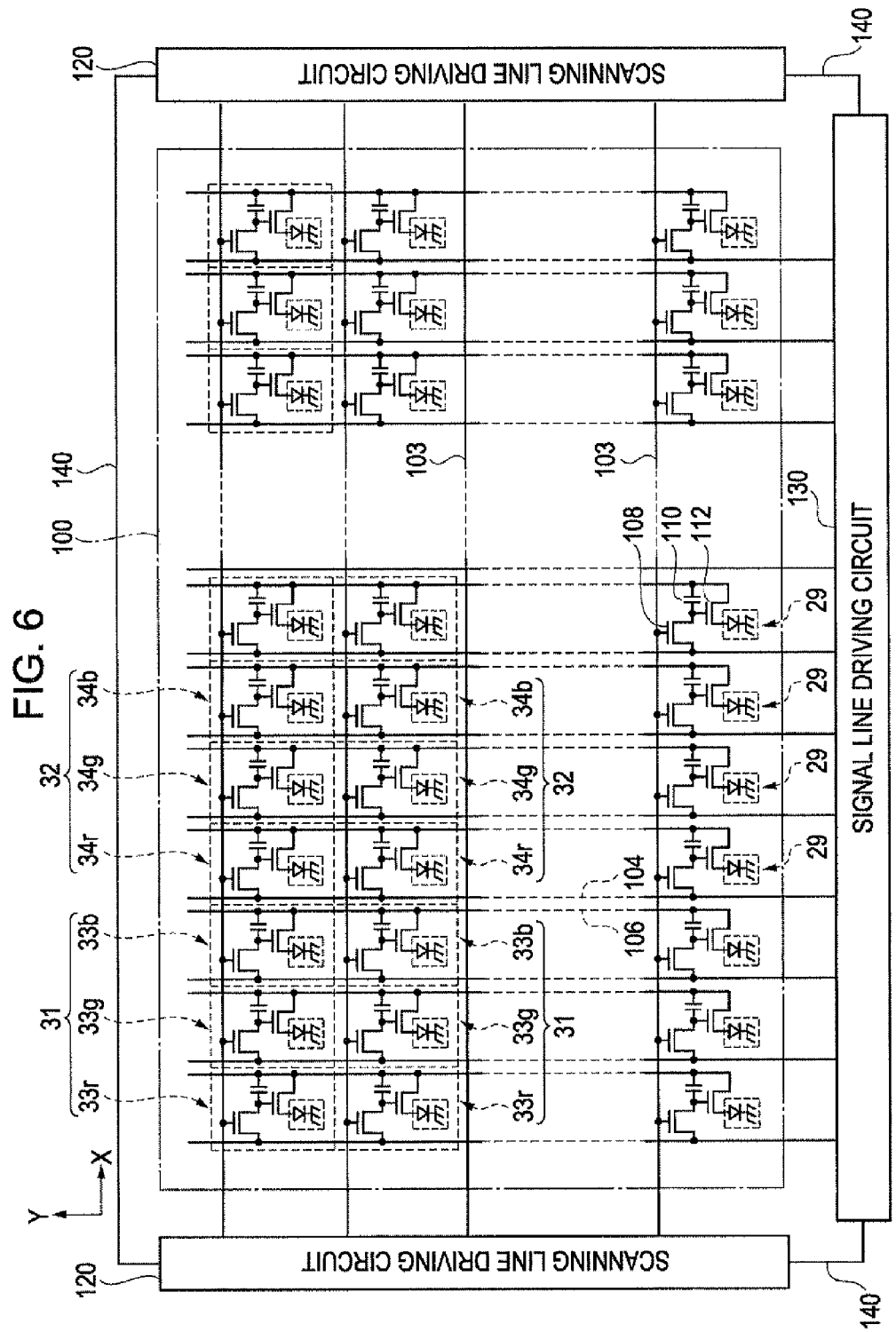

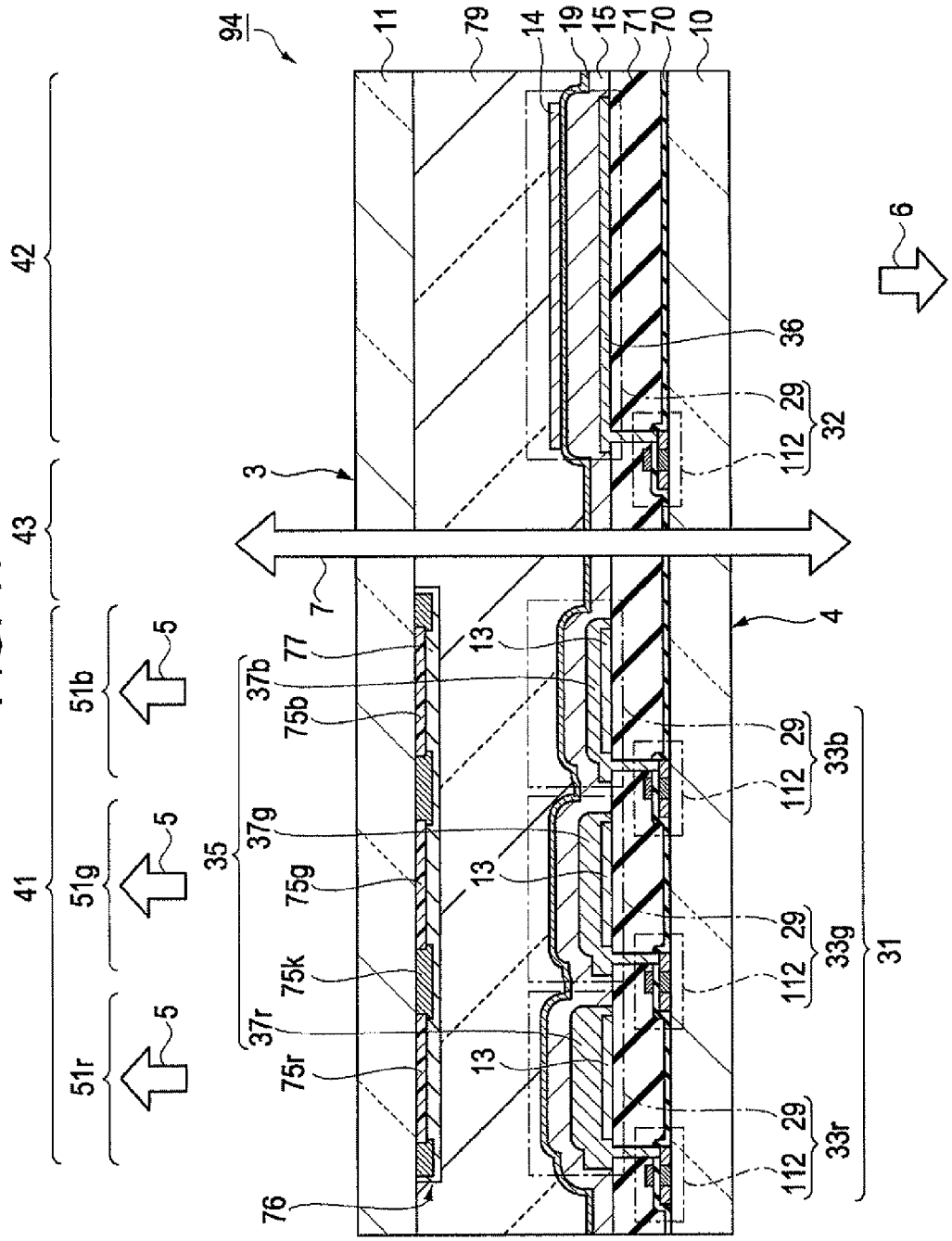

DISPLAY DEVICE

BACKGROUND

1. Technical Field

The present invention relates to a display device.

2. Related Art

Organic EL (electroluminescent) devices, which use an electroluminescence phenomenon where light is emitted due to applying of an electric current, are increasingly being used as display devices. As a new use application in recent years, there has been considered a use method where both front and back surfaces can be seen at the same time. As a double-sided display organic EL device corresponding to this use application, in JP-A-2000-58260, for example, a configuration is proposed where light emitting functional layers including at least an electroluminescence layer are formed on both sides of a cathode. Also, in JP-A-2001-332392, a configuration is proposed where a part of a cathode is formed of a transmissive member, and in JP-A-2002-252089, a configuration is proposed where electrodes with a light emitting functional layer interposed therebetween, that is both an anode and a cathode, are formed of transmissive members.

However, in the configuration where light emitting functional layers are formed on both sides of a cathode, there may be an increase in manufacturing cost. Also, forming both an anode and a cathode of a transmissive member narrows the width of selection of electrode materials so that there may be an impact on the light emitting characteristics and the like. In addition, in a more advanced use application, a use method is also proposed where a plurality of people faces each other with a display device therebetween and meetings or the like are carried out while looking at each other and at the display device. For this use application, it is necessary that a transmissive region is provided in the display device. In addition, in order for the plurality of people who are facing each other to see an image which is not reversed left and right, it is necessary that an image on one side of the display device and an image on the other side are each formed independently.

SUMMARY

An advantage of some aspects of the invention is that it solves at least some of the problems described above, and can be realized as embodiments or application examples described below.

APPLICATION EXAMPLE 1

According to this application example of the invention, there is provided a display device including a first substrate; a second substrate; a light emitting functional layer which is disposed between the first substrate and the second substrate; a first pixel which emits light to the second substrate side and is disposed above the first substrate, the first pixel having a first pixel electrode disposed between the light emitting functional layer and the first substrate, a second electrode disposed between the light emitting functional layer and the second substrate, and a first reflecting layer disposed between the first pixel electrode and the first substrate; a second pixel which emits light to the first substrate side and is disposed above the first substrate, the second pixel having a second pixel electrode disposed between the light emitting functional layer and the first substrate, a second electrode disposed between the light emitting functional layer and the second substrate, and a second reflecting layer disposed between the second electrode and the second substrate; and a driving element which drives the first pixel electrode and the second pixel electrode is disposed above first substrate.

According to the configuration, by forming a two-layer reflecting layer, it is possible to emit light generated inside the light emitting functional layer from both the first substrate side and the second substrate side. Accordingly, it is possible to realize a double-sided display device where increases in manufacturing costs are suppressed.

APPLICATION EXAMPLE 2

In regard to the display device mentioned above, a transmissive region is disposed so that light can transmitted through the first substrate and the second substrate without the reflecting layer being disposed in a plan view.

According to the configuration, the opposite side through the display device is visible while looking at a displayed image. Accordingly, in a meeting or the like, it is possible to realize a double-sided display device where both the image and other people are visible.

APPLICATION EXAMPLE 3

In regard to the display device mentioned above, the transmissive region is a region where both the first pixel electrode and the second pixel electrode are not disposed.

According to the configuration, light emitted by the light emitting functional layer can be suppressed in the transmissive region and display quality can be improved.

APPLICATION EXAMPLE 4

In regard to the display device mentioned above, the second electrode and the light emitting functional layer of the first pixel are in the same layer as the second electrode and the light emitting functional layer of the second pixel.

According to the configuration, light can be emitted from both the first substrate side and the second substrate side without an increase in the forming processes of the second electrode and the light emitting functional layer. Accordingly, it is possible to realize a double-sided display device where increases in manufacturing costs are suppressed.

APPLICATION EXAMPLE 5

In regard to the display device mentioned above, at least one of the two types of pixel electrodes of the first pixel electrode and the second pixel electrode has three types of a sub pixel electrode of a red sub pixel electrode, a green sub pixel electrode and a blue sub pixel electrode which are each driven independently, and a pixel region which corresponds to the one pixel electrode is partitioned into three types of sub pixel regions, a red sub pixel region which includes the red sub pixel electrode in a plan view and emits red light, a green sub pixel region which includes the green sub pixel electrode in a plan view and emits green light, and a blue sub pixel region which includes the blue sub pixel electrode in a plan view and emits blue light.

According to the configuration, it is possible to realize a double-sided display device where at least one surface can display a color image while increases in manufacturing costs are suppressed.

APPLICATION EXAMPLE 6

In regard to the display device mentioned above, on a side opposite to the reflecting layer side of the light emitting functional layer in the three types of the sub pixel regions, a color filter is formed corresponding to a color of light emitted from each of the sub pixel regions.

According to the configuration, it is possible to realize a double-sided display device where at least one surface can display color images while use of the light emitting functional layer is shared between the sub pixels.

APPLICATION EXAMPLE 7

In regard to the display device mentioned above, the three types of the sub pixel electrodes include a semi-transmissive reflecting layer on a side opposite to the reflecting layer of the light emitting functional layer, and an optical resonator structure, which optically resonates light with a specific wavelength range, is formed between the semi-transmissive reflecting layer and the reflecting layer.

According to the configuration, it is possible to realize a double-sided display device where at least one surface can display color images while use of the light emitting functional layer is shared between the sub pixel regions.

APPLICATION EXAMPLE 8

In regard to the display device mentioned above, at least one of the first pixel electrode and the second pixel electrode is provided in a zigzag shape.

According to the configuration, streaky unevenness can be suppressed in the display region and display quality can be improved.

APPLICATION EXAMPLE 9

In regard to the display device mentioned above, at least one of the first pixel electrode and the second pixel electrode is provided in a column shape.

According to the configuration, a reflecting layer formed on the second substrate side can be provided in a strip shape and it is possible to easily provide a mask formation film.

BRIEF DESCRIPTION OF THE DRAWINGS

The invention will be described with reference to the accompanying drawings, wherein like numbers reference like elements.

FIGS. 2A and 2B are diagrams illustrating an arrangement configuration of each region in a display region of the organic EL device.

FIG. 4 is a circuit configuration diagram of the organic EL device relating to the first embodiment.

FIG. 5 is a schematic cross-sectional diagram of a pixel region of the organic EL device relating to the first embodiment.

FIG. 6 is a circuit configuration diagram of an organic EL device relating to a second embodiment.

FIG. 11 is a schematic cross-sectional diagram of a pixel region of the organic EL device relating to the fourth embodiment.

DESCRIPTION OF EXEMPLARY EMBODIMENTS

Hereinafter, as a display device relating to the invention, an organic EL device will be described with reference to the accompanying drawings. Here, the invention can be also realized by an EL device using inorganic EL materials as long as it is an EL device. However, the present embodiment will be described using an example of an organic EL device using organic EL materials as EL materials. Also, in regard to each of the diagrams below, each layer and part is set to a size so that it can be recognized in the diagram, and the reduction scale of each layer and part may differ from reality.

First Embodiment

Figure 1:
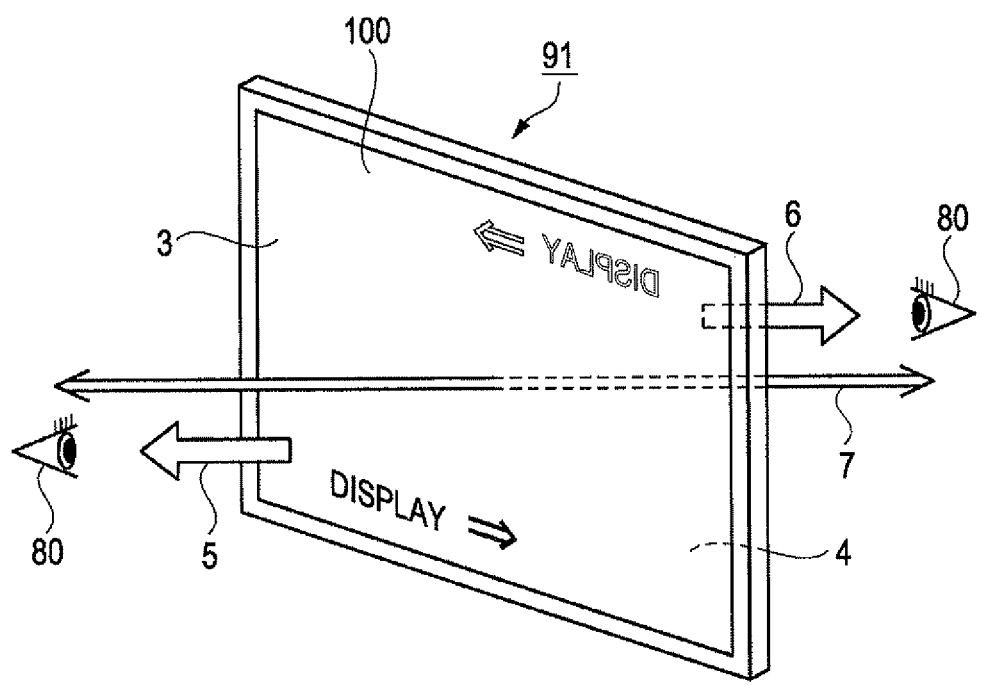
FIG. 1 is a perspective view showing an outline of an organic EL device relating to a first embodiment.

FIG. 1 is a perspective view illustrating an outline of an organic EL device 91 relating to the first embodiment of the invention and organic EL devices relating to each of the other embodiments described later. The organic EL device 91 has a display region 100 where both the upper surface and lower surface substantially overlap in a plan view. A surface seen with an eye 80 on a left side is an upper surface 3 which is a first surface, and a surface seen with an eye 80 on a right side is a lower surface 4 which is a second surface.

From the upper surface 3, a first display light 5 is irradiated, and from the lower surface 4, a second display light 6, which is different display light from the first display light 5, is irradiated. "Different display light" refers to light forming a different image. Accordingly, the organic EL device 91 can display images which are each different to two viewers who are positioned to be facing with the organic EL device 91 therebetween. Here, different images cannot be formed in the case where a light emitting functional layer 15 which is described later (refer to FIG. 5) is interposed between a pair of electrodes which are formed of transmissive materials and the same display light is irradiated from both the front and back surfaces (the upper and lower surfaces). That is, an image where left and right direction is correct as shown in the diagram cannot be displayed to the two viewers, and an image which is reversed left and right is displayed to either one of the viewers. Accordingly, at the least, text information cannot be correctly displayed.

The organic EL device 91 of the embodiment can display a common image to two viewers without being reversed left and right by displaying images which are each different on both the front and back surfaces (the upper surface 3 and the lower surface 4) by sharing the use of the light emitting functional layer 15 described later. Also, in the display region 100, a transmissive region (a region where a portion of external light 7 can pass through) is formed in a regular manner. Accordingly, two viewers who are facing each other with the organic EL device therebetween can see an image formed in the display region 100 as well as the face of the other person. Therefore, in a meeting or the like, it is possible to carry out so-called face-to-face conversation while looking at an image (image information) without having to change a line of sight.

FIGS. 2A and 2B are diagrams illustrating an arrangement configuration of each region in the display region 100 of the organic EL device 91 and organic EL devices relating to each of the other embodiments described later. As the regions, there are three types of regions, a first pixel region 41 which irradiates the first display light 5 toward the upper surface, a second pixel region 42 which irradiates the second display light 6 toward the lower surface, and a transmissive region 43 where a portion of external light 7 can pass through. The three types of the regions are formed in the display region 100 in a regular manner.

FIG. 2A shows a configuration where each region (41, 42, 43) is disposed in individual columns (in the Y direction of FIG. 4 and the like). The arrangement configuration has an advantage in that, compared to a zigzag arrangement, it is easier to form a second reflecting layer 14 (refer to FIG. 5) described later. Also, there is also an advantage in that a first reflecting layer 13 (refer to FIG. 5) described later can be formed in a strip shape so as to span across a plurality of first pixel regions 41. Furthermore, the arrangement configuration is effective also in the case where the area of each region (41, 42, 43) is different. Here, in this diagram, each region is disposed in columns in a vertical direction, but it is also possible to have an arrangement where each region is disposed in a row shape in a horizontal direction (an X direction in FIG. 4).

FIG. 2B shows a configuration where each region (41, 42, 43) is disposed in a zigzag shape. Due to the arrangement, a relatively smooth image display is possible. A column arrangement as shown in FIG. 2A is adopted in the organic EL device 91 and organic EL devices relating to each of the other embodiments described later. However, the arrangement is not limited to this, and it is possible for a zigzag arrangement as shown in FIG. 2B to be adopted in all of the embodiments.

Figure 3A:
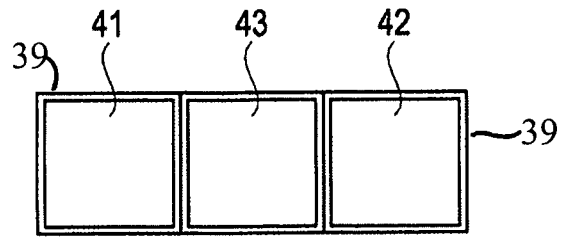
FIGS. 3A to 3D are diagrams illustrating an arrangement of pixel regions in the display region.

FIGS. 3A to 3D are diagrams illustrating cases where each region (41, 42, 43) is further partitioned with partition layer 39. Mainly, in organic EL devices of the second, third and fourth embodiments described later, a case is shown where the first pixel region 41 and the second pixel region 42 are partitioned as sub pixel regions according to the color of irradiated light. FIG. 3A shows each region (41, 42, 43) of the organic EL device 91 relating to the embodiment. The organic EL device 91 displays in black and white so that neither the first pixel region 41 nor the second pixel region 42 have sub pixel regions. That is, both of the pixel regions (41, 42) can irradiate white light at an arbitrary intensity but cannot irradiate colored light. Here, "white light" refers to not just pure white light but uses a concept that, although there is slight chromaticity, monochromatic light where chromaticity cannot change is also included.

FIG. 4 is a circuit configuration diagram of the organic EL device 91 relating to the first embodiment. The organic EL device 91 is provided with the display region 100 and a peripheral region (with no symbols) formed in a peripheral portion of the display region. In the display region 100, a plurality of scanning lines 103 extending in an X direction, a plurality of signal lines 104 extending in a Y direction, and a plurality of power source lines 106 extending in the same Y direction are formed. In each rectangular partition where the X direction is specified by the signal lines 104 and the power source lines 106 and the Y direction is specified by the scanning lines 103, first organic EL pixels (referred to as "first pixels" hereinafter) 31 and second organic EL pixels (referred to as "second pixels" hereinafter) 32 are formed in columns as shown in FIG. 2A. Here, in the description below, a collective term for the first pixels 31 and the second pixels 32 is "organic EL pixels (31, 32)." This is the same for other components which will be described later.

The first pixels 31 are pixels corresponding to the first pixel region 41 and are configured by an organic EL element 29 provided with a first pixel electrode 35 (refer to FIG. 5) and other components which will be described later. The second pixels 32 are pixels corresponding to the second pixel region 42 and are configured by an organic EL element 29 provided with a second pixel electrode 36 (refer to FIG. 5) and other components which will be described later. As the organic EL device 91 relating to the embodiment is a device displaying black and white images, there is no distinguishing of the color of light to be irradiated by each pixel. Here, the organic EL pixels (31, 32) is a functional concept configured by each component of the organic EL element 29 and the like. The pixel regions (41, 42) are regions which irradiate display light and are a planar concept. Here, the transmissive region 43 is disposed in the display region 100, but as the transmissive region 43 is a region which is not formed by the organic EL element 29 and the like, it is not shown in FIG. 4 which is a circuit diagram.

The organic EL device 91 is an active matrix display device and each of the organic EL pixels (31, 32) is formed of a switching TFT (thin film transistor) 108 which supplies a scanning signal to a gate electrode 23 (refer to FIG. 5) via the scanning lines 103, a holding capacitor 110 which holds an image signal supplied from the signal lines 104 via the switching TFT 108, a driving TFT 112 which supplies an image signal held by the holding capacitor 110 to the gate electrode 23, the organic EL element 29 (refer to FIG. 5) in which driving electric current flows from the power source lines 106 via the driving TFT 112, and the like.

In the peripheral region, a scanning line driving circuit 120 and a signal line driving circuit 130 are formed. The scanning line driving circuit 120 sequentially supplies scanning signals to the scanning lines 103 in correspondence with each type of signal supplied by an external circuit which is not shown. The signal line driving circuit 130 supplies image signals to the signal lines 104. In the power source lines 106, an image driving current is supplied from an external circuit which is not shown. The operations of the scanning line driving circuit 120 and the signal line driving circuit 130 are synchronized with each other by a synchronizing signal supplied from an external circuit via a synchronizing signal line 140.

When the scanning lines 103 are driven and the switching TFT 108 is in an on state, the potential of the signal lines 104 at that point in time is held by the holding capacitor 110, and the level of the driving TFT 112 is decided in correspondence with the state of the holding capacitor 110. Next, a driving current flows from the power source lines 106 to an image electrode via the driving TFT 112, so that the organic EL element 29 emits light corresponding to the size of the driving current to irradiate as display light (5, 6) from the pixel regions (41, 42) corresponding to each of the pixels (31, 32).

FIG. 5 is a schematic cross-sectional diagram of the display region 100 of the organic EL device 91 (refer to FIGS. 1 and 2) relating to the first embodiment. As shown in the diagram, the organic EL device 91 is configured by an element substrate 10, an opposing substrate 11 and components formed between this pair of substrates. The upper surface (the first surface) 3 is a surface on a side opposite to the opposing substrate 11 side, that is, a surface on a side opposite to a side where each component, which will be described later, on the opposing substrate 11 is formed. The lower surface (the second surface) 4 is a surface on a side opposite to the element substrate 10 side, that is, a surface on a side opposite to a side where each component on the element substrate 10 is formed.

The display region 100 is provided with a total of three types of the regions, in a plan view as described above, the first pixel region 41 which irradiates first display light 5 from the upper surface 3, the second pixel region 42 which irradiates second display light 6 from the lower surface 4, and the transmissive region 43 which at least a portion of external light 7 can pass through. In addition, in the first pixel region 41, the first pixels 31 are formed, and in the second pixel region 42, the second pixels 32 are formed. As shown in the diagram, the difference between the first pixels 31 and the second pixels 32 is the formation position of the reflecting layers (13, 14) in the vertical direction of the substrate surface. Due to a difference in the formation position, the irradiating direction of the display light (5, 6) can be changed. Here, when symbols are written in brackets and separated by a comma as described above, this refers to both a "first component" and a "second component."

The transmissive region 43 is configured of each layer formed over substantially the entire surface of the display region 100 and the pair of substrates in the vertical direction, and the reflecting layers (13, 14) and the like described above are not formed. In addition, each layer formed over the entire surface is formed of transmissive or semi-transmissive materials. Also, the element substrate 10 and the opposing substrate 11 are formed of transmissive materials such as glass or the like. Accordingly, at least a portion of external light 7 can pass through the transmissive region 43 through the organic EL device 91.

Here, the pixel electrodes (35, 36) are not formed in the transmissive region 43, because it is not necessary to pass an electric current through the light emitting functional layer 15 described later. However, if the pixel electrodes are formed of ITO or the like which have transmissive properties (which will be described later), the pixel electrodes (35, 36) may be formed in a configuration where a layer of the same material is electrically isolated from the pixel electrodes.

Each component configuring the organic EL pixels (31, 32) will be described below in order from the element substrate 10 side. Here, the organic EL device 91 relating to the embodiment and organic EL devices relating to each of the other embodiments described later have the characteristic that the irradiating directions of the display light from the first pixels 31 and the second pixels 32 are different. Consequently, in FIG. 5, among the components configuring both the pixels (31, 32) described above, the organic element 29 and the driving TFT (hereinbelow, simply referred to as "TFT") 112 which drives the organic EL element is shown and the switching TFT 108 and the holding capacitor 110 are not shown in the diagram.

The TFT 112 is formed on the upper layer of the element substrate 10. In the boundary surface between the element substrate 10 and the TFT 112, a protective layer may be separately formed. Here, "upper" and "upper layer" refer to the opposing substrate 11 side. The TFT 112 is formed of a semiconductor layer 21, the gate electrode 23 formed by patterning the same layer as the scanning lines 103, a gate insulating layer 70 formed between the semiconductor layer 21 and the gate electrode 23, and the like. The region of the semiconductor layer 21 which is overlapped with the gate electrode 23 in a plan view is the channel region 22, and a source region 25 and a drain region 26 are formed on both sides of the channel region 22. Here, the gate electrode 23 has a configuration where Ti (titanium), AlCu (an aluminum copper alloy) and TiN (titanium nitride) are laminated in this order from the element substrate 10 side.

In the upper layer of the TFT 112, an interlayer insulating layer 71 is formed by laminating an inorganic insulating material such as silicon nitride, silicon oxide or the like and a organic material such as acrylic resin or the like. In the drain region 26, the pixel electrodes (35, 36) are electrically connected via a contact hole 27 formed by locally etching the interlayer insulating layer 71. It is necessary that the formation material of the pixel electrodes (35, 36) be transmissive and conductive, and also that the formation material have a higher work function than a cathode 19 which is a common electrode described later. Therefore, in the organic EL device 91, the pixel electrodes (35, 36) are formed of ITO (an alloy of indium oxide and tin oxide) which is a transmissive and conductive material. IZO (an alloy of indium oxide and zinc oxide) may be used instead of ITO. Furthermore, PEDOT, which is a transmissive and conductive material and does not contain metal, may be used.

In the lower layer of the first pixel electrode 35, the first reflecting layers 13 and a protective layer 28 which covers the first reflecting layer is formed. It is preferable that the formation material of the first reflecting layer 13 (and the second reflecting layer 14 described later) is a material which has high reflectivity and is superior in workability (patterning). Accordingly, the first reflecting layer 13 (and the second reflecting layer 14 described later) of the organic EL device 91 is formed of Al (aluminum) or the like. The first reflecting layer 13 has a thickness of approximately 80 nm and is formed by patterning the Al layer formed over the entire surface.

The protective layer 28 is formed of silicon oxide and performs a function of protecting the first reflecting layer 13 during formation of the first pixel electrode 35. Also, as silicon nitride is an insulating material, there can be electrical insulation between the first pixel electrode 35 and the first reflecting layer 13. Accordingly, if there is a configuration where the entire surface of the first reflecting layer 13 is covered by the protective layer 28 formed of silicon nitride, the first reflecting layer 13 can be formed in a strip shape so as to span across a plurality of the first pixel regions 41 adjacent in the Y direction (refer to FIG. 4) and not formed in an island shape. That is, in the Y direction, there can be a configuration where the first pixel electrode 35, which is patterned in an island shape, is disposed in the formation region of the first reflecting layer 13 in a plan view.

In addition, also in the X direction, there can be a configuration where the first pixel electrode 35 is disposed in the formation region of the first reflecting layer 13. That is, the first reflecting layer 13 is wider in a plan view than the first pixel electrode 35 in regions other than the formation region of the contact hole 27. That is, the first reflecting layer 13 can be formed to cover the first pixel electrode 35 in a plan view.

Here, it is not essential that the first pixel electrode 35 is transmissive so that it can be formed of a reflective material such as Ag (silver) or the like. In that case, the first pixel electrode 35 can also be used as the first reflecting layer 13. In addition, the protective layer 28 is not necessary. Furthermore, the first reflecting layer 13 (and the second reflecting layer 14 described later) may be formed, not by patterning using a photolithography method or the like, but by combining film formation and patterning using a mask film formation method such as a mask deposition method or the like.

In the upper layer of the element substrate 10 where the pixel electrodes (35, 36) are formed, the light emitting functional layer 15 is formed over the entire surface. Accordingly, in the two types of regions of the first pixel region 41 and the second pixel region 42, the light emitting functional layer 15 is a layer which is shared. Accordingly, in the production of the organic EL device 91 relating to the embodiment (and organic EL devices relating to each of the other embodiments described later), the formation process of the light emitting functional layer 15 is only performed once.

The light emitting functional layer 15 is a collective term, and specifically, the light emitting functional layer 15 is formed by laminating a total of four layers, a hole injection layer, a hole transport layer, an organic EL layer and an electron transport layer, in that order from the element substrate 10 side. It may be considered that there are a total of five layers including an electron injection layer formed in the upper layer of the electron transport layer. As the organic EL device 91 of the invention is, not a color but, a black and white (monochrome) display device, the organic EL layer is a layer that emits white light. Accordingly, the light emitting functional layer 15 is a layer with a white light emitting function. Here, the organic display device described above is not limited to a layer formed of a single material. In the organic EL layer, layers which each emit light of different colors may be laminated so that, in total, white light is irradiated. Also, it is not necessary that pure white light is irradiated and light slightly tinged with color may be irradiated.

In the upper layer of the light emitting functional layer 15, the cathode 19 as a common electrode is formed over the whole surface in the same manner as the light emitting functional layer 15. The organic EL element 29 is the laminated body of the cathode 19, the light emitting functional layer 15, and the pixel electrodes (35, 36). When an electric voltage is applied to the pixel electrodes (35, 36) via the TFT 112, electric current flows between the pixel electrodes (35, 36) and the cathode 19 via the light emitting functional layer 15, and light is emitted corresponding to the amount of electric current by the organic EL layer included in the light emitting functional layer 15.

As described above, the first reflecting layer 13 is formed on the element substrate 10 side of the first pixel electrode 35. Accordingly, in regard to the first pixel electrode 41, the first reflecting layer 13 is positioned between the light emitting functional layer 15 and the element substrate 10, and emitted light directed toward the element substrate 10 side is reflected toward to the opposing substrate 11 side. Also, in regard to the first pixel electrode 41, emitted light directed toward the opposing substrate 11 side is irradiated in that state as first display light 5 from the first surface 3, that is, from the opposing substrate 11 side. Accordingly, all of the emitted light generated by the first pixels 31 is irradiated as first display light 5 from the first surface 3, that is, from the opposing substrate 11 side.

As the organic EL device 91 is a black and white display organic EL device, a resonator structure is not needed for the organic EL element 29. Accordingly, the cathode 19 is not necessarily required to have semi-transmissivity and may be transmissive (translucent). On the other hand, only a portion of external light 7 is required to pass through the transmissive region 43 (refer to FIGS. 2A and 2E) so that it is not necessary that the cathode 19 is completely transmissive. Accordingly, the cathode 19 may have transmissivity or may have semi-transmissivity.

Also, it is necessary that the cathode 19 is conductive as it is an electrode, and furthermore, it is necessary that it is formed from a material which has a lower work function than the formation material of pixel electrodes (35, 36) so that electron injection properties can be secured. In regard to the organic EL device 91, on top of 2 nm of Al and 1 nm of LiF (lithium fluoride) laminated as the electron injection layer, ITO is laminated as the cathode 19 to secure transmissivity and electron injection properties.

In the upper layer of the cathode 19 in the second pixel region 42, the second reflecting layer 14 is formed. The second reflecting layer 14 is formed of Al and has a thickness of 80 nm in the same manner as the first reflecting layer 13. However, it is preferable that the formation method of the second reflecting layer 14 is due to a mask film formation method such as a mask deposition method or the like in order to also suppress damage to the cathode 19 which is a base. Different from the first reflecting layer 13, it is not necessary that the second reflecting layers 14 are electrically independent from each other. Also, it is not a problem even if the second reflecting layer 14 overlaps with the contact hole 27 in a plan view. Accordingly, in the embodiment, the second reflecting layer 14 can be formed in a strip shape extending in the Y direction (refer to FIG. 4).

The second reflecting layer 14 has a function as a cathode wiring (supplementary wiring) as well as a function of reflecting light generated in the light emitting functional layer 15 to the element substrate 10 side. As described above, the cathode 19 is formed to be extremely thin so as to exhibit transmissivity. Accordingly, the cathode 19 has high surface resistance and a tendency for a reduction in the amount of electric current flowing in the organic EL layer due to a voltage drop in the vicinity of the center of the organic EL device. As the second reflecting layer 14 is laminated on the upper surface of the cathode 19 with nothing therebetween, the second reflecting layer 14 and the cathode 19 are electrically integrated.

In addition, the second reflecting layer 14 is formed to have a thickness of 80 nm to be sufficiently thick compared to the layer thickness of the cathode 19, and is formed regularly in the display region 100. Accordingly, in the region where transmissivity is not required, the second reflecting layer 14 increases the layer thickness of the cathode 19 in practice and reduces the surface resistance of the cathode 19. Due to the reduction in surface resistance, a voltage drop is suppressed even in the vicinity of the center. Thus, the organic EL device 91 can display an improved quality image with hardly any difference in luminance and the like in the center section and the peripheral section.

The second pixels 32 do not have a reflecting layer on the lower layer of the second pixel electrode 36. Thus, among emitted light generated in the light emitting functional layer 15, emitted light directed toward the element substrate 10 side is irradiated in that state as second display light 6 from the second surface 4. On the other hand, in the upper layer of the light emitting functional layer 15, as the second reflecting layer 14 is provided, the emitted light directed toward the opposing substrate 11 side is reflected by the second reflecting layer 14 to be irradiated from the second surface 4 side as second display light 6 toward the element substrate 10 side. Accordingly, substantially all of the emitted light generated by the second pixel region 42 is irradiated from the second surface 4 side as second display light 6.

A sealing layer 79 is formed on the upper layer of the cathode 19 on which the second reflecting layer 14 is formed, that is, between the cathode 19 and the opposing substrate 11. The sealing layer 79 is shown in the diagram as a single layer, but in practice, is formed of a laminated body formed of a total of three layers, a cathode protecting layer, an organic buffer layer, and a gas barrier layer which are formed in that order from the upper layer of the cathode 19, and an adhesive layer having transmissivity which fills in between the laminated body and the opposing substrate 11. As all of the individual layers configuring the sealing layer 79 described above are formed from transmissive materials, at least a portion of external light 7 can pass through the transmissive region 43. Accordingly, two people facing each other through the organic EL device 91 can visually recognize each other.

As is described above, in the organic EL device 91 of the embodiment, at least a portion of external light 7 can pass through the transmissive region 43, first display light 5 is irradiated to the opposing substrate 11 side in the first pixel region 41, and second display light 6 is irradiated to the element substrate 10 side in the second pixel region 42. Therefore, a light blocking layer such as the reflecting layers (13, 14) is not formed in the transmissive region, and on the other hand, in the pixel regions (41, 42), light generated by the light emitting functional layer 15 is irradiated only to one side due to the reflecting layers (13, 14).

Here, in the region where the pixel electrodes (35, 36) are formed, as emitted light is generated by the light emitting functional layer 15, it is necessary to include the pixel electrodes (35, 36) in the reflecting layers (13, 14) in a plan view so as to suppress the irradiating of display light (5, 6) toward the opposite side. However, in the first pixel region 41, the first reflecting layer 13 cannot be formed in the formation region of the contact hole 27. Also, as the reflecting layers (13, 14) reflect external light, there is a possibility of a reduction in display quality if the portion where the reflecting layers (13, 14) and the pixel electrodes (35, 36) do not overlap, that is, the portion where the reflecting layers (13, 14) protrude out from the pixel electrodes (35, 36) in a plan view, is formed to be excessively wide.

In order to suppress this phenomenon, in the region other than the transmissive region 43, a partition (not shown) may be formed in a region surrounding the pixel electrodes (35, 36) in a plan view. In the region described above, by forming a partition, which is formed of an insulating material with light blocking properties, between the pixel electrodes (35, 36) and the light emitting functional layer 15, both the irradiating of emitted light from the light emitting functional layer 15 toward a nonpreferred side and the reflecting of external light 7 can be suppressed. Thus, image quality can be improved.

Effects of the Embodiment

As described above, the organic EL device 91 has two types of pixels, the first pixels 31 and the second pixels 32. Both the pixels (31, 32) have a similar configuration and the only difference is the formation position of the reflecting layers (13, 14) (position in the vertical direction).

Here, even in terms of general organic EL devices, it is typical that a reflecting layer is formed in order to irradiate display light only from either one of the element substrate 10 side or the opposing substrate 11 side. Accordingly, the organic EL device 91 relating to the embodiment, by only newly forming a single layer of reflecting layer, display light can be irradiated from both surfaces of the first surface 3 and the second surface 4. Also, as the organic EL device 91 is an active matrix display device, different emitted light can be generated between adjacent pixels (31, 32). Accordingly, by slightly increasing the number of manufacturing processes, that is, by only increasing the manufacturing costs, the organic EL device 91 can irradiate display light from both surfaces of the first surface 3 and the second surface 4 to form images which are each different in the display regions 100 of both of the surfaces (3, 4).

Here, different images described above include images where the same text information has been reversed left and right. Images can be formed on the display regions 100 of both surfaces also in the case where the pixel electrodes (35, 36) and the cathode 19 are formed of transmissive materials without using a structure like the organic EL device 91. However, when the image on one of the surfaces is used as a reference, left and right are reversed in the other surface so that at least text information cannot be correctly displayed.

The organic EL device 91 can form text information without left and right reversing on the display regions 100 of both surfaces. Thus, in a meeting or the like, a plurality of people can carry out a conversation while visually recognizing shared information through the organic EL device. Furthermore, as there is a transmissive region 43 in the display region 100, facial expressions and the like of a person on the other side of the display device and images can be simultaneously visually recognized. Accordingly, by using the organic EL device 91 relating to the embodiment, a meeting or the like, which is carried out while referencing image information such as text information, can be effectively accomplished. Furthermore, as both of the surfaces (3, 4) can perform display, the organic EL device 91 and organic EL devices (92, 93, 94) relating to each of other embodiments described later can display advertising with no blind spots in the cases where they are used for digital signage.

Here, in FIGS. 2A and 2E and FIG. 3A, the area ratio of the three types of the regions (41, 42, 43) which are formed in the display region 100 are shown in the diagram to be substantially 1:1:1. However, the area ratio is not limited to the above value and can be arbitrarily set. Also, when it is not necessary to see a face and facial expressions of another person and the like, there can be only two types of regions, the first pixel region 41 and the second pixel region 42, without the transmissive region 43 being formed.

Second Embodiment

Next, the second embodiment of this invention will be described. The organic EL device 92 relating to the present embodiment has the same purpose of use and configuration as the organic EL device 91 relating to the first embodiment, and the components are also the same. That is, as shown in FIG. 1, both the first surface 3 and the second surface 4 have display regions 100 which substantially overlap in a plan view, and both of the surfaces (3, 4) can display images which are each different. In addition, due to the transmissive region 43 (refer to FIGS. 2A and 2B and the like) formed in the display region 100, the opposing side (that is, the opposite side) through the organic EL device can be visually recognized. The arrangement configuration of the three types of regions including the transmissive region 43 is also the same. That is, a column arrangement as shown in FIG. 2A has been adopted.

The organic EL device 92 is different from the organic EL device 91 of the first embodiment in that it is a color display and not a black and white display. Accordingly, the two regions other than the transmissive region 43 are further partitioned into sub pixel regions which irradiate any one of the three primary colors.

Figure 3B:
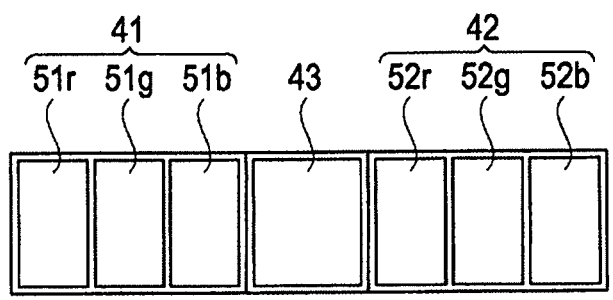

In FIG. 3B, an arrangement configuration of sub pixel regions in the pixel regions (41, 42) of the organic EL device 92 is shown. As shown in the diagram, the first pixel region 41 is partitioned into sub pixel regions, which irradiate any one of three primary colors, a first red sub pixel region 51r which irradiates red light, a first green sub pixel region 51g which irradiates green light, and a first blue sub pixel region 51b which irradiates blue light.

In the same manner, the second pixel region 42 is also partitioned into sub pixel regions, which irradiate any one of three primary colors, a second red sub pixel region 52r which irradiates red light, a second green sub pixel region 52g which irradiates green light, and a second blue sub pixel region 52b which irradiates blue light. Accordingly, both pixel regions (41, 42) can irradiate light of an arbitrary color obtained by mixing the three primary colors by an arbitrary ratio. Accordingly, the organic EL device 92 can display (form) a color image in the display regions 100 on the sides of both the first surface 3 and the second surface 4.

Here, in the description below, in the case when, for example, the first sub regions 51 (r, g, b) are described, it refers to the three types of the sub pixel regions described above in the first pixel region 41 included as shown in FIG. 3B.

FIG. 6 is a circuit configuration diagram of the organic EL device 92. FIG. 6 is equivalent to FIG. 4 of the first embodiment described above, and FIG. 7 described later is equivalent to FIG. 5 of the first embodiment. As described above, the organic EL device 92 has the same purpose of use and the like as the organic EL device 91 relating to the first embodiment. The configuration also is the same except for that it is a color display and not a black and white display. Therefore, in FIG. 6 and FIG. 7, common configuration components are given the same symbols and a part of the description is not repeated.

The organic EL device 92 is partitioned into the display region 100 and a peripheral region surrounding the display region 100 in a plan view. In the peripheral region, the scanning line driving circuit 120, the signal line driving circuit 130, and the synchronizing signal line 140 which synchronizes both the driving circuits are formed. In the display region 100, the plurality of scanning lines 103 extending in the X direction, the plurality of signal lines 104 extending in the Y direction, and the plurality of power source lines 106 extending in the same Y direction are formed. In addition, in the display region 100, the first pixels 31 and the second pixels 32 are formed in columns as shown in FIG. 2A described above. Here, as described above, the first pixels 31 and the second pixels 32 can also be formed in a zigzag shape and not in columns. Also, in the same manner as the organic EL device 91 described above, as FIG. 6 is a circuit diagram, the transmissive region 43 (refer to FIGS. 2A and 23) is not shown.

The pixels (31, 32) of the organic EL device 92 is configured of three types of sub pixels so as to correspond to the relation between the sub pixel regions and the pixel regions described above. That is, the first pixels 31 are configured by three types of sub pixels, first red sub pixels 33r, first green sub pixels 33g, and first blue sub pixels 33b. In the same manner, the second pixels 32 are configured by three types of sub pixels, second red sub pixels 34r, second green sub pixels 34g, and second blue sub pixels 34b. Each lower case letter included in each of the symbols refers to the color of the emitted light which is irradiated from each of the sub pixel regions (51, 52) described above corresponding to each of the sub pixels (33, 34). It is the same for other configuration components (color filters and the like described later).

Each of the sub pixels (33, 34) can convert white light generated by the light emitting functional layer 15 to any one of three primary colors of red light, green light, or blue light due to color filters 75 (r, g, b) described later and the resonator structure, and can irradiate the colored light from each of the sub pixel regions (51, 52). Here, "each sub pixel (33, 34)" refers to a common term for the six types of the sub pixels described above, and "each sub pixel region (51, 52)" refers to a common term for the six types of the sub pixel regions described above.

As shown in the diagram, the six types of the sub pixels (33, 34) described above are formed in each rectangular partition where the X direction is specified by the signal lines 104 and the power source lines 106 and the Y direction is specified by the scanning lines 103. In addition, each sub pixel (33, 34) is provided with the organic EL element 29, the switching TFT 108, the holding capacitor 110, and the driving TFT 112. In addition, a driving current flows from the power source lines 106 to the organic EL element 29 via the driving TFT 112, so that the organic EL element 29 emits light corresponding to the size of the driving current in the same manner as the pixels (31, 32) in the organic EL device 91 relating to the first embodiment. Accordingly, an amount of emitted light in each of the individual organic EL elements 29 can be arbitrarily controlled. As a result, a color image can be formed in the display region 100.

Figure 7:
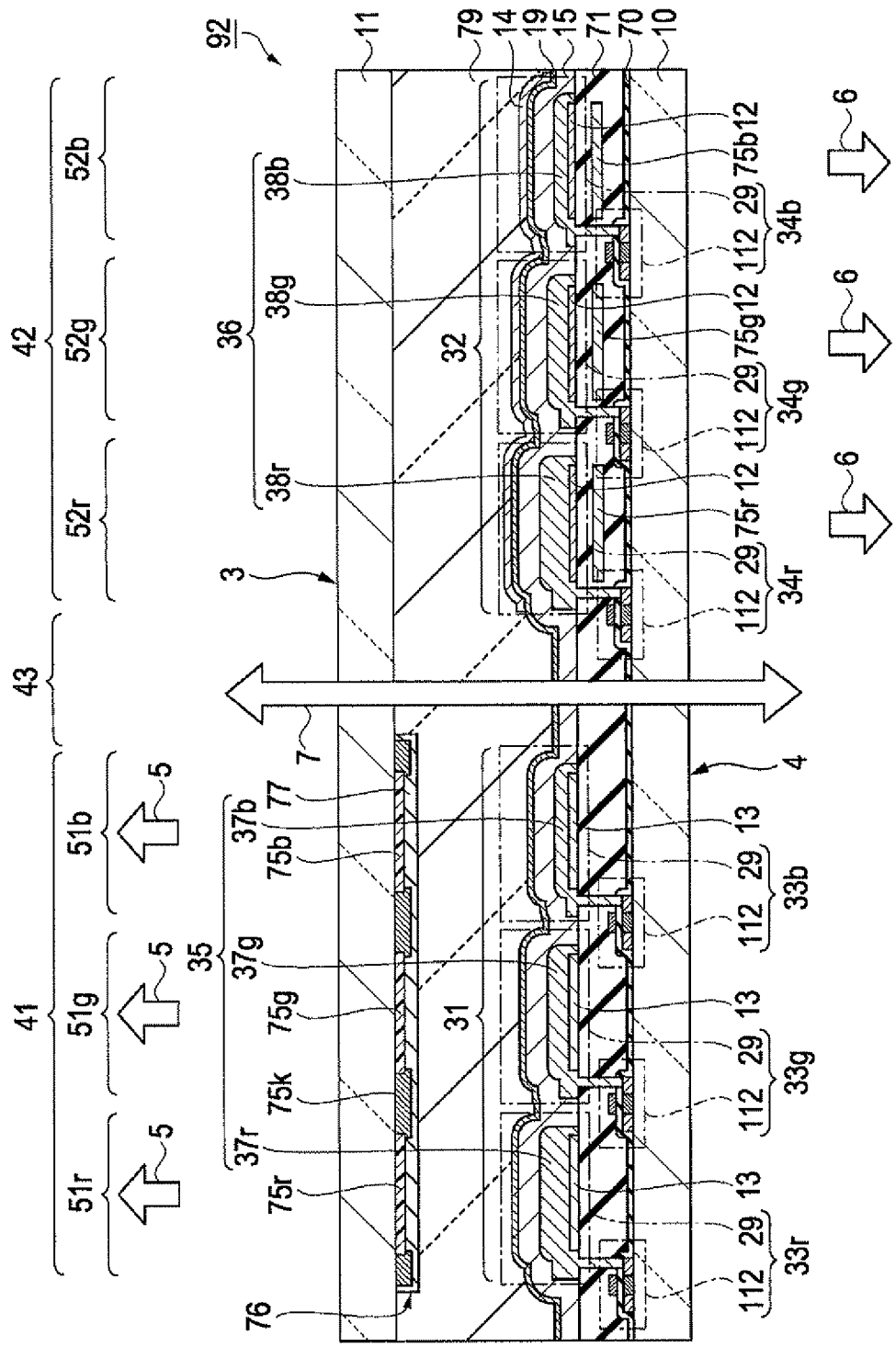
FIG. 7 is a schematic cross-sectional diagram of a pixel region of the organic EL device relating to the second embodiment.

FIG. 7 is a schematic cross-sectional diagram of the display region 100 of the organic EL device 92. As shown in the diagram, the display region 100 of the organic EL device 92 includes a total of three types of the regions, the first pixel region 41 which irradiates first display light 5 from the first surface 3, the second pixel region 42 which irradiates second display light 6 from the second surface 4, and the transmissive region 43. In addition, as described above, the first pixel region 41 and the second pixel region 42 further include three types of the sub pixel regions. In addition, each of the sub pixel regions (51, 52) corresponds one-to-one with the sub pixels (33, 34) in a plan view.

That is, the first red sub pixel region 51r corresponds to the first red sub pixel 33r, the first green sub pixel region 51g corresponds to the first green sub pixel 33g, and the first blue sub pixel region 51b corresponds to the first blue sub pixel 33b. In the same manner, the second red sub pixel region 52r corresponds to the second red sub pixel 34r, the second green sub pixel region 52g corresponds to the second green sub pixel 34g, and the second blue sub pixel region 52b corresponds to the second blue sub pixel 34b.

As described above, the sub pixels (33, 34) have the same components as the "pixels" of the organic EL device 91. That is, the sub pixels (33, 34) are configured by the (driving) TFT 112, the organic EL element 29, and the switching TFT 108 and the holding capacitor 110 which are not shown in the diagrams, and the like. Accordingly, in the same manner to the organic EL device 91 relating to the first embodiment, an arbitrary amount of light can be irradiated by controlling voltage applied between a pair of electrodes configuring the organic EL element 29. Here, the organic EL element 29 is essentially a laminated body of a pair of electrodes (the cathode 19 and the pixel electrodes (35, 36)) and the light emitting functional layer 15. However, in FIG. 7, for descriptive purposes, the organic EL element 29 is shown including the reflecting layers (13, 14) or a semi-transmissive reflecting layer 12. Also, in FIG. 7, the protective layer 28 (refer to FIG. 5), which covers the first reflecting layer 13, is not shown in the diagram.

Each of the pixel electrodes (35, 36) of the organic EL device 92 is also configured by three types of sub pixel electrodes. That is, the first pixel electrode 35 is configured by a first red sub pixel electrode 37r, a first green sub pixel electrode 37g, and a first blue sub pixel electrode 37b. The second pixel electrode 36 is configured by a second red sub pixel electrode 38r, a second green sub pixel electrode 38g, and a second blue sub pixel electrode 38b.

The light emitting functional layer 15 of the organic EL device 92 is a layer with a white light emitting function provided with an organic EL layer which emits white light, in the same manner as the light emitting functional layer 15 of the organic EL device 91 of the first embodiment. In addition, by emphasizing light with a specific wavelength range in white light and irradiating the light after making it colored light, the organic EL device 92 is able to perform color display. As a result, the organic EL device 92 differs compared to the organic EL device 91 in terms of the points below.

First, color filters 75 (r, g, b) are formed to correspond to each sub pixel (33, 34). Next, the cathode 19 is formed of a material layer which has semi-transmissivity, that is, which has approximately 50% transmissivity. In addition, next, between the second sub pixel electrodes 38 (*r, g, b*) and the element substrate 10, the semi-transmissive reflecting layer 12, which is a material layer having semi-transmissivity, is formed in regard to the second sub pixels 34 (*r, g, b*). The semi-transmissive layer (the cathode 19 and the semi-transmissive reflecting layer 12) is configured in a resonator structure by being combined with the reflecting layers (13, 14). In the organic EL device 92, the emitted colored light is obtained by the resonator structure of and the function of the color filters 75 (*r, g, b*) described above.

First, light irradiated from the second surface 4 is described. The second sub pixels 34 (*r, g, b*) are provided with the semi-transmissive reflecting layer 12 between the second sub pixel electrodes 38 (*r, g, b*) and the interlayer insulating layer 71 as described above, and the second reflecting layer 14 on the upper surface of the cathode 19. In addition, color filters 75 (*r, g, b*) are provided between the second sub pixel electrodes 38 (*r, g, b*) and the element substrate 10. Here, the semi-transmissive reflecting layer 12 is formed of Al or an MgAg alloy with a layer thickness of approximately 10 nm.

Approximately half of the light emitted by the light emitting functional layer 15 is directed toward the opposing substrate 11 side and is reflected by the second reflecting layer 14 to be directed toward the element substrate 10 side. Also, the remaining approximately half of the light is directed directly toward the element substrate 10 side. In addition, the approximately half of the light directed toward the element substrate 10 side passes through the semi-transmissive reflecting layer 12 and the color filter 75 described later and is irradiated from the second surface 4. The remaining approximately half of the light is reflected by the semi-transmissive reflecting layer 12 to be directed toward the opposing substrate 11 side. Then, the light is reflected by the second reflecting layer 14 to be directed again to the semi-transmissive reflecting layer 12 side. The resonance is the repeating of the light, which is emitted by the light emitting functional layer 15, being reflected between the semi-transmissive reflecting layer 12 and the second reflecting layer 14. As a result, light with a specific wavelength range, which is determined by the distance between the semi-transmissive reflecting layer 12 and the second reflecting layer 14, is emphasized.

The distance between the semi-transmissive reflecting layer 12 and the second reflecting layer 14 is resonant length. In the organic EL device 92, the resonant length is formed to match the wavelength of irradiated light of each of the second sub pixel 34 (*r, g, b*) by changing the thickness of the second pixel electrode 36, that is, the thickness of the ITO layer, for each of the second sub pixel electrodes 38 (*r, g, b*). Accordingly, in regard to light which passes through the semi-transmissive reflecting layer 12, red light is emphasized in the second red sub pixel 34*r*, green light is emphasized in the second green sub pixel 34*g*, and blue light is emphasized in the second blue sub pixel 34*b*.

The color filter 75 is a colored transmissive resin layer, and has a function of improving color purity by allowing a higher ratio of light with a specific wavelength range to pass through compared to light with a different wavelength range to emphasize the light with the specific wavelength. Specifically, the red color filter 75*r* has the function of allowing a higher ratio of light with a wavelength range equivalent to red light to pass through, the green color filter 75*g* has the function of allowing a higher ratio of light with a wavelength range equivalent to green light to pass through, and the blue color filter 75*b* has the function of allowing a higher ratio of light with a wavelength range equivalent to blue light to pass through. Light, which is light with a specific wavelength range which has been emphasized by the resonator structure described above, becomes light with its color purity further improved due to the color filter and is irradiated from the second surface 4.

Due to the resonator structure and the color filter described above, the second sub pixels 34 (*r, g, b*) can irradiate light with a specific wavelength range of any one of the three primary colors. Accordingly, the second pixels 32 provided with the sub pixels can irradiate light of an arbitrary color (chromaticity), which has been obtained by mixing an arbitrary ratio of three primary colors of light, as second display light 6 from the second surface 4. Accordingly, the organic EL device 92 can form color images on the second surface 4 side.

Next, light irradiated from the first surface 3 is described. The first sub pixels 33 (*r, g, b*) are provided with the first reflecting layer 13 between the first sub pixel electrodes 37 (*r, g, b*) and the interlayer insulating layer 71 (via the protective layer which is not shown). In addition, as described above, the cathode 19 is formed of a material layer having semi-transmissivity. Accordingly, the resonator structure is formed between the first reflecting layer 13 and the cathode 19. The resonant length of the resonator structure is set to a thickness matching the wavelength of the irradiating light of each of the first sub pixels 33 (*r, g, b*) in the same manner as the resonant length with regard to the second pixels 32. Here, similar to the semi-transmissive reflecting layer 12, the formation material of the cathode 19 is Al or an MgAg alloy with a layer thickness of approximately 10 nm.

A color filter layer 76 is formed on the sealing layer 79 side of the opposing substrate 11 in regard to the first pixel region 41. Here, the color filter layer 76 is formed of the color filter 75 (*r, g, b*) corresponding to each emitted light color, a black matrix 75*k* which blocks light between adjacent color filters, and an overcoat layer 77 which protects the color filter. Light, which is light with a specific wavelength range which has been emphasized by the resonator structure described above, becomes light (colored light) with its color purity further improved due to the color filter. Accordingly, due to the resonator structure and the color filter layer 76 described above, the three types of the first sub pixels 33 (*r, g, b*) which the first pixels 31 are configured from can irradiate any one of three primary colors of light as first display light 5 from the first surface 3. Accordingly, the organic EL device 92 can form a color image on the first surface 3.

As described above, the organic EL device 92 can form a color image on both surfaces, that is, both surfaces of the first surface 3 and the second surface 4. Also, a portion of external light 7 can pass through the transmissive region 43, in a similar manner to the region in the organic EL device 91 relating to the first embodiment. Accordingly, when the organic EL device 92 relating to the embodiment is used in a meeting or the like, two people facing each other can look at color images, which are necessary for each of them, while visually recognizing each other through the organic EL device.

Here, the ratio of light pass through the semi-transmissive layer described above is not limited to approximately 50%. The transmissivity of the semi-transmissive layer may be increased by improvement in the color purity further depending on the color filters 75 (*r, g, b*).

Also in regard to the organic EL device 92 relating to the embodiment, the necessity to suppress the irradiation of display light (5, 6) to the opposite side, that is, irradiation of light to the lower surface 4 side in the first pixel region 41 and irradiation of light to the upper surface 3 side in the second pixel region 42, is the same as for the organic EL device 91 relating to the first embodiment described above. Also, the necessity to suppress the reflecting of external light 7 is also the same. These phenomena can be suppressed in the first pixel region 41 as the organic EL device 92 is provided with the black matrix 75k in the color filter layer 76, but may cause problems in the second pixel region 42.

In order to suppress these phenomena, it is preferable that the pixel electrodes (35, 36) are formed to be included inside of the reflecting layers (13, 14) in a plan view in the same manner as the organic EL device 91. Also, the effectiveness of also forming a partition in order to suppress the phenomena described above is the same. By forming the partition, which is formed of an insulating material with light blocking properties so as to surround the pixel electrodes (35, 36) in a plan view, between the pixel electrodes (35, 36) and the light emitting functional layer 15, both the irradiating of emitted light from the light emitting functional layer 15 toward a nonpreferred side and the reflecting of external light 7 can be suppressed. Also, a light blocking layer may be formed on a specific region of both rear surfaces of the substrates (10, 11), that is, the surface on the opposite side to the sealing layer 79 side. If the light blocking layer is formed on the rear surface of the element substrate 10 in regard to the first pixel region 41 and if the light blocking layer is formed on the rear surface of the opposing substrate 11 in regard to the second pixel region 42, reflecting of external light 7 is suppressed and display quality can be improved.

Effects of the Embodiment

The organic EL device 92 relating to the embodiment is provided with the first pixels 31 which irradiate emitted light (display light) to the first surface 3 side and the second pixels 32 which irradiate emitted light (display light) to the second surface 4 side. By forming the two types of pixels in the display region 100, images which are each different can be formed on both surfaces. Both types of pixels described above have common configuration components such as the pixel electrodes (35, 36), driving elements including the TFT 112, the light emitting functional layer 15, and the like. Accordingly, the organic EL device 92 relating to the embodiment is configured by newly adding the semi-transmissive reflecting layer (either 12 or 19), the color filters 75 (r, g, b), the reflecting layers (13, 14) to an existing (typical) organic EL device which can display color. That is, by the addition of the configuration components, forming of images which are each different is possible by irradiating display light from both surfaces of the first surface 3 and the second surface 4. Also, as the organic EL device 92 relating to the embodiment has the transmissive region 43, it is possible for another person to be visually recognized through the organic EL device 92. Accordingly, when the organic EL device 92 is used in a meeting or the like, a plurality of people can carry out a conversation while visually recognizing both each other and shared color images.

Here, the effects described above also can be obtained by combining two of the organic EL devices (including transmissive regions 43). However, for a device with this configuration, it is necessary to form two units of all of the components of the light emitting functional layer 15 and the like, so that there is a problem with cost. The organic EL device 92 of the embodiment has the characteristics that the effects described above can be obtained by a slight addition of manufacturing processes. Here, the area ratio of the three types of the regions (41, 42, 43) formed in the display region 100 is not limited to 1:1:1 but can be arbitrarily set. This is the same as for the organic EL device 91 relating to the first embodiment. However, there are limitations on the ratio of the sub pixel regions in regard to the first pixel region 41 and the second pixel region 42. The configuration where the transmissive region 43 may not be provided is also the same as for the organic EL device 91 relating to the first embodiment.

Third Embodiment

Next, the third embodiment of this invention is described. An organic EL device 93 of the third embodiment is a double-sided display organic EL device in the same manner as the organic EL device in the embodiments described above. The provision of the transmissive region 43 is also the same. The difference is that color images are displayed on one surface (one side) and black and white images are display on the other surface (other side). Accordingly, the purpose of use and configuration are the same as both the organic EL device 91 and the organic EL device 92, and the components are also similar. Therefore, in the description below, configuration components which are common with configuration components of the organic EL devices (91, 92) described above are given the same symbols and a part of the description is not repeated.

Figure 3C:
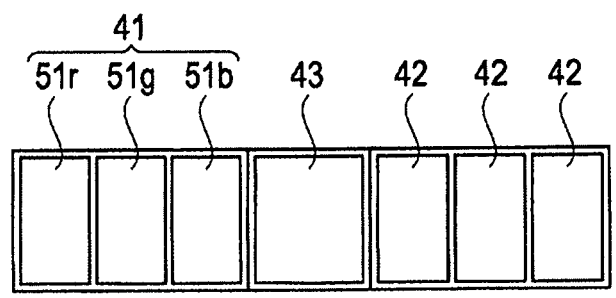

FIG. 3C is a diagram illustrating an arrangement configuration of pixel regions in the display region 100 of the organic EL device 93. As shown in the diagram, the first pixel region 41, which irradiates display light to the first surface 3 side (refer to FIG. 9 described later), is configured by three types of the first sub pixel regions 51 (r, g, b). On the other hand, the second pixel region 42, which irradiates display light to the second surface 4 side (refer to FIG. 9 described later), does not have sub pixel regions, and each of the regions corresponding to the three types of the first sub pixel regions 51 are the second pixel regions 42. In addition, in between the first pixel region 41 and the second pixel region 42, the transmissive region 43 is formed which allows at least a portion of external light to pass through. In the same manner as the organic EL devices (91, 92) of the embodiments described above, external light 7 (refer to FIG. 9 and the like) can pass between the adjacent sub pixel regions (r, g, b) and between the regions (41, 42, 43).

Figure 8:
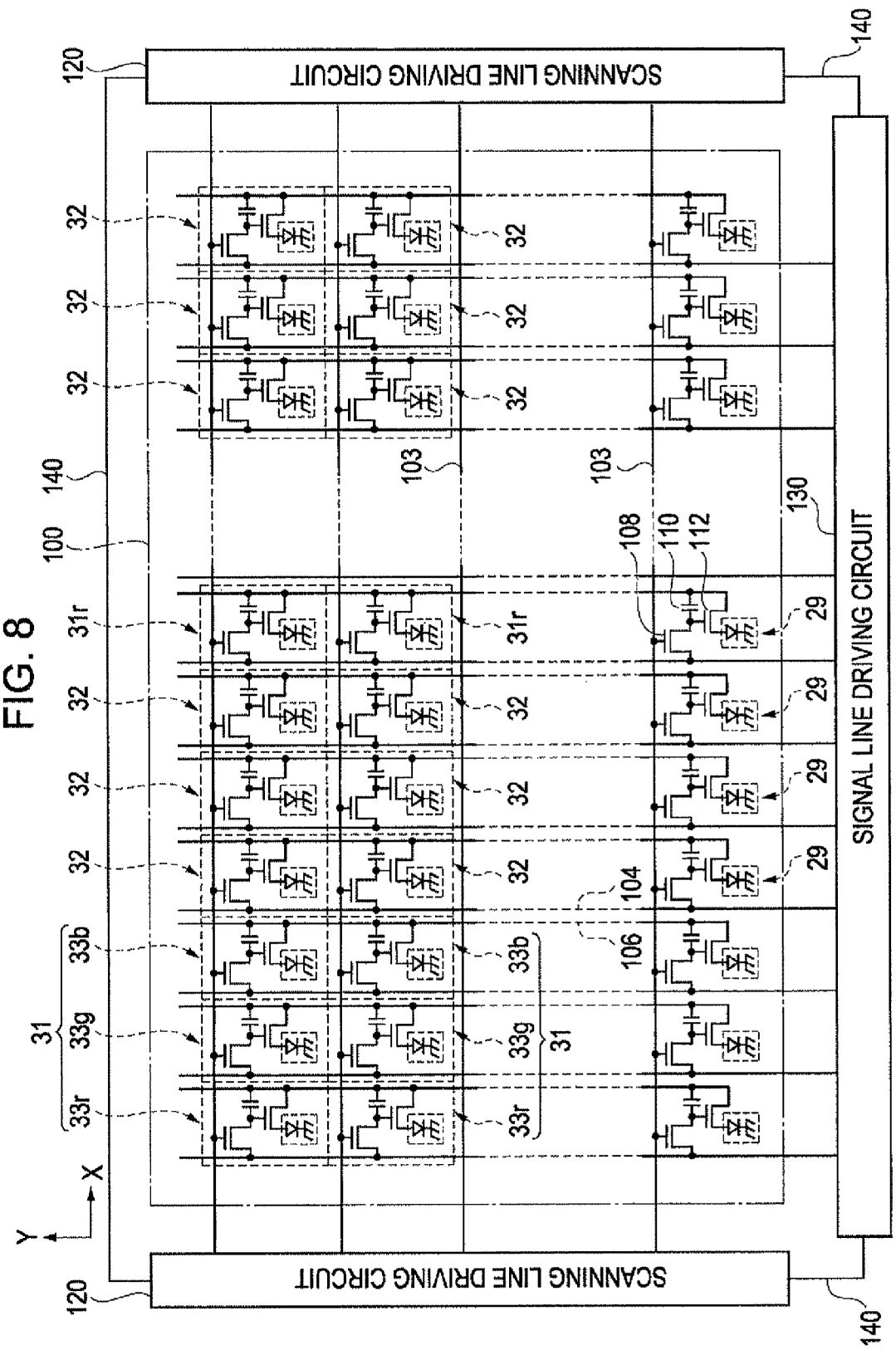
FIG. 8 is a circuit configuration diagram of an organic EL device relating to a third embodiment.

FIG. 8 is a circuit configuration diagram of the organic EL device 93 relating to the third embodiment. The diagram is equivalent to FIG. 4 of the first embodiment described above, and the transmissive region 43 (refer to FIGS. 2A and 2B) is not shown in the diagram in the same manner as FIG. 4. As shown in the diagram, the first pixels 31 are configured by three types of sub pixels, the first red sub pixels 33r, the first green sub pixels 33g, and the first blue sub pixels 33b. When corresponding to FIG. 3C, the first red sub pixel region 51r corresponds to the first red sub pixel 33r, the first green sub pixel region 51g corresponds to the first green sub pixel 33g, and the first blue sub pixel region 51b corresponds to the first blue sub pixel 33b. In addition, three of the second pixel regions 42 which are disposed in a line in a row direction each correspond to the second pixels 32.

Both the first sub pixels 33 (r, g, b) and the second pixels 32 described above have the organic EL element 29, the TFT 112, the holding capacitor 110, and the switching TFT 108. Accordingly, the first sub pixels 33 (r, g, b) and the second pixels 32 have substantially the same configuration. Each of the pixels (31, 32) described above and each of the first sub pixels 33 (r, g, b) described above are disposed in columns in the same manner as the organic EL device 91 and the organic EL device 92 described above. That is, identical pixels (31, 32) and identical first sub pixels 33 (r, g, b) are disposed in the Y direction.

Figure 9:
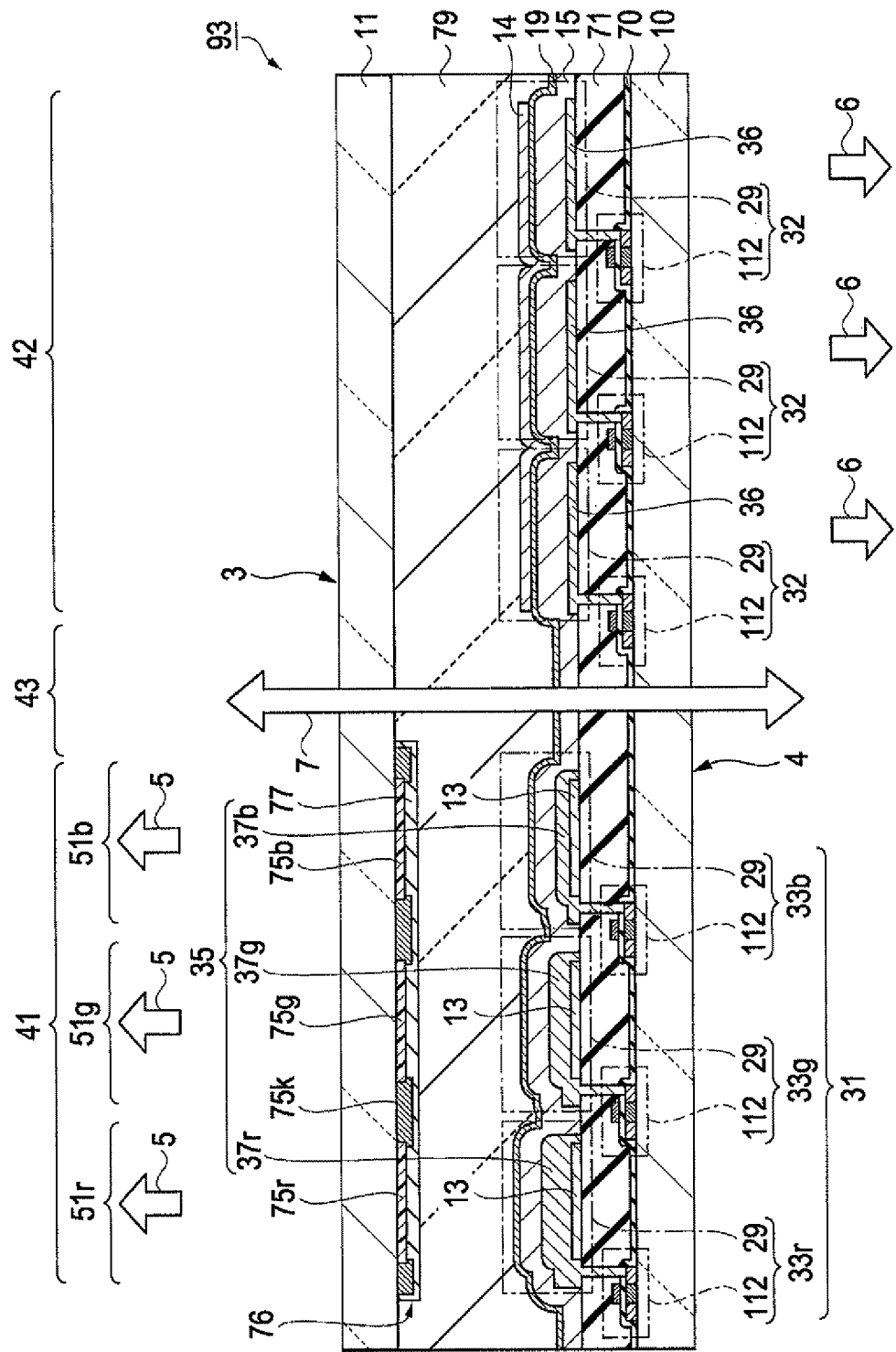
FIG. 9 is a schematic cross-sectional diagram of a pixel region of the organic EL device relating to the third embodiment.

FIG. 9 is a schematic cross-sectional diagram of the display region 100 of the organic EL device 93 relating to the third embodiment. As shown in the diagram, the cross-sectional configuration, that is, the configuration in the vertical direction of the substrate surface, is similar to the configuration of the organic EL device 91 shown in FIG. 5 and the organic EL device 92 shown in FIG. 7. That is, the color filter layer 76 is formed in the first pixel region 41 where the first sub pixels 33 (r, g, b) are formed. In addition, the second reflecting layer 14 is formed on the upper layer of the cathode 19 in the second pixel region 42 where the second pixels 32 are formed. Between the first pixel region 41 and the second pixel region 42 is the transmissive region 43 which allows external light 7 to pass through the element substrate 10 and the opposing substrate 11.

The thickness of the pixel electrodes of the first sub pixels 33 (r, g, b), that is, the first sub pixel electrodes 37 (r, g, b), are each different, and the resonator structure is formed between the first reflecting layer 13 and the cathode 19 having semi-transmissivity. Here, in the same manner as the organic EL device 92 described above, the first pixel electrode 35 is matched with the first sub pixel electrodes 37 (r, g, b). As the sub pixels are individually controlled, light, which has been mixed in an arbitrary ratio, is irradiated from each of the first pixel regions 41. Accordingly, color images are formed on the first surface 3 side.

In the same manner as the second pixels of the organic EL device 91, the second pixels 32 are not provided with the color filter layer 76 nor the resonator structure. Accordingly, there is no function for emphasizing light with a specific wavelength range, and the emitted light of the light emitting functional layer 15 is irradiated as second display light 6 from the second surface 4 side with hardly any change to the wavelength distribution.

Both the first pixel electrode 35 and the second pixel electrode 36 are formed of ITO. In addition, the first blue sub pixel electrode 37b and the second pixel electrode 36 are formed by patterning the same ITO layer. Accordingly, the layer thickness is substantially the same. However, as the second pixels 32 have no semi-transmissive layer between the light emitting functional layer 15 and the element substrate 10, there is no resonator structure formed between the second reflecting layer 14 and the element substrate 10. Accordingly, in regard to the second pixels 32, there is no emphasizing of light with a wavelength range equivalent to blue light. Accordingly, black and white images are formed in the second surface 4 side.

Also in regard to the organic EL device 93 relating to the embodiment, it is preferable to suppress the irradiating of display light (5, 6) to the opposite side and the reflecting of external light 7 in the same manner as the organic EL devices (91, 92) of the embodiments described above. To that end, in the same manner as the organic EL devices (91, 92) of the embodiments described above, it is also preferable that the pixel electrodes (35, 36) are formed to be included inside of the reflecting layers (13, 14) in a plan view, that the partition, which is formed of an insulating material with light blocking properties so as to surround the pixel electrodes (35, 36) in a plan view, is formed between the pixel electrodes (35, 36) and the light emitting functional layer 15, and further that the light blocking layer is formed on a specific region of both rear surfaces of the substrates (10, 11), that is, the surfaces on the opposite side to the sealing layer 79 side.

Effects of the Embodiment

As described above, the organic EL device 93 of the embodiment forms color images on one surface (the first surface 3) thereof, and on the other surface (the second surface 4), forms black and white images of contents which are different from the color images described above. In addition, due to the transmissive region 43, the opposite side can be visually recognized through the organic EL device. Accordingly, in the same manner as the organic EL devices (91, 92) of the embodiments described above, when the organic EL device 93 is used in a meeting or the like, a plurality of people can carry out a conversation while visually recognizing each other and shared images.

Here, the cross-sectional configuration in regard to the first pixel region 41 is substantially the same as an organic EL device which performs displaying of color images on only one surface using a typical organic EL layer (that is, the light emitting functional layer provided with an organic EL layer) which emits white light. By only newly forming the second reflecting layer 14 on the other region of the organic EL device, that is, the second pixel region 42, black and white images can be displayed (formed) on the other surface.

In regard to the double-sided display organic EL device, there may be cases where it is sufficient if color images are displayed on only one surface. For example, in the case where it is used in a meeting or the like, there is a case where color images are displayed only to the side of visiting clients. The organic EL device 93 of the embodiment can realize a double-sided display organic EL device which displays color images on only one side by a minimum increase in the number of manufacturing processes, that is, a minimum increase in manufacturing costs.

Fourth Embodiment

Next, the fourth embodiment of this invention is described. An organic EL device 94 of the fourth embodiment is a double-sided display organic EL device which displays (forms) color images on one surface and displays black and white images on the other surface in the same manner as the organic EL device 93 in the third embodiment described above. The provision of the transmissive region 43 is also the same as the organic EL device 93, and components are also similar. Therefore, in the description below, configuration components which are common with configuration components of the organic EL device 93 are given the same symbols and a part of the description is not repeated.

Figure 3D:
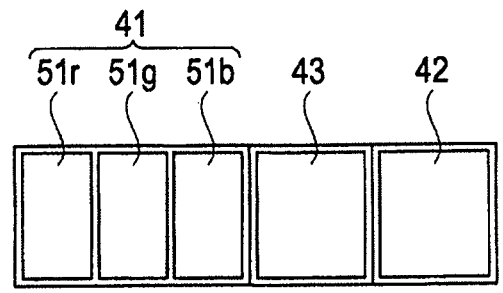

FIG. 3D is a diagram illustrating an arrangement configuration of the pixel regions in the display region 100 of the organic EL device 94. As shown in the diagram, the first pixel region 41, which is a region which irradiates display light to the first surface 3 side (refer to FIG. 11 described later), is configured by three types of the first sub pixel regions 51 (r, g, b) in the same manner as the corresponding region of the organic EL device 93. In addition, in a position (region) opposing the first pixel region 41 via the transmissive region 43, one second pixel region 42, which is a region which irradiates display light to the second surface 4 side (refer to FIG. 11 described later), is formed.

Figure 10:
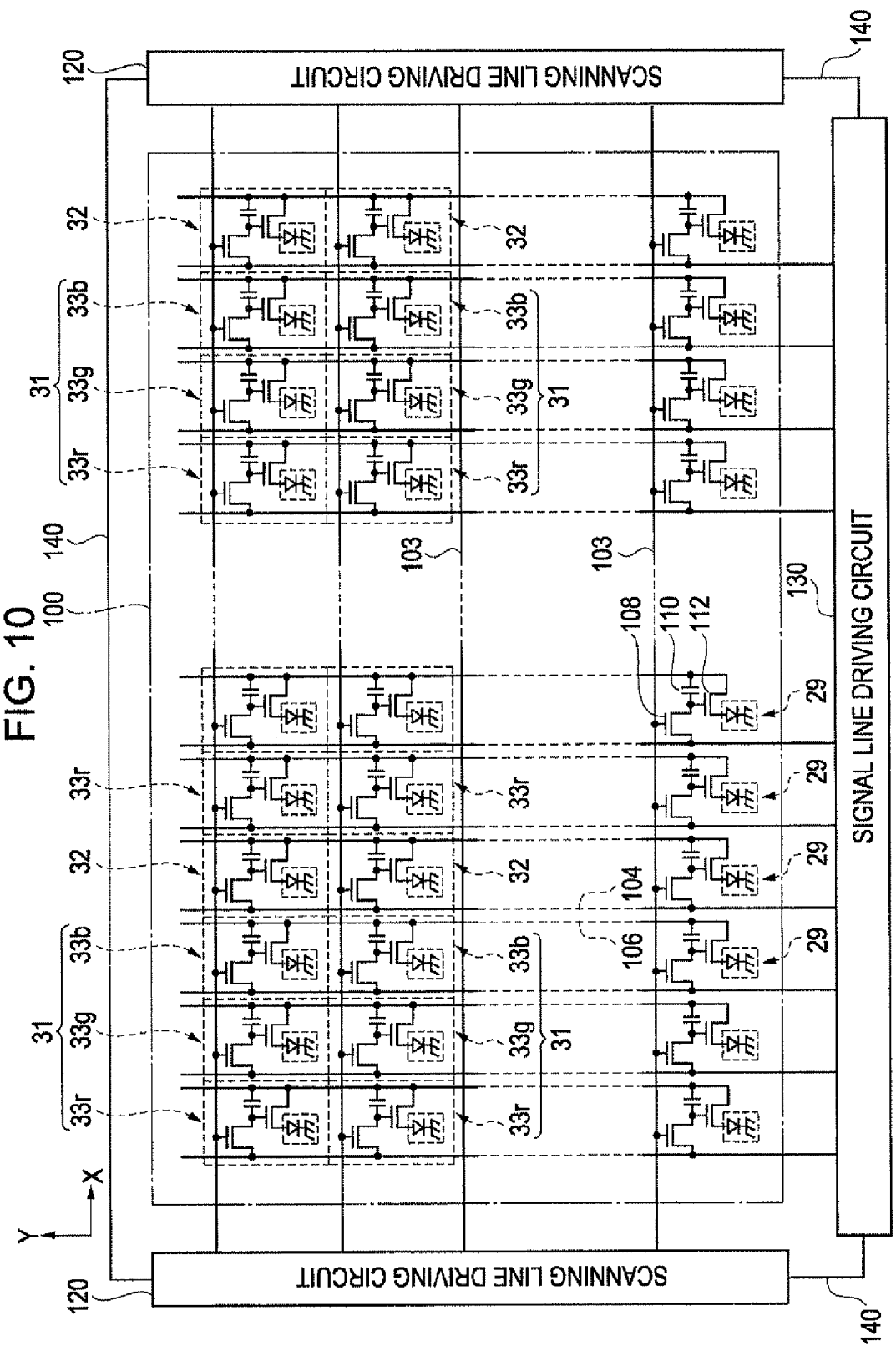
FIG. 10 is a circuit configuration diagram of an organic EL device relating to a fourth embodiment.

FIG. 10 is a circuit configuration diagram of the organic EL device 94 relating to the fourth embodiment. FIG. 10 is a diagram equivalent to FIG. 4 of the first embodiment described above. In the same manner as FIG. 4, as FIG. 10 is a circuit diagram, the transmissive region 43 described above is not shown. As shown in the diagram, the configuration of the first pixels 31 is the same as the configuration of the pixels for the organic EL device 92 and the organic EL device 93, and is formed of three sub pixels. The configuration of the second pixels 32 is the same as the configuration of the pixels for the organic EL device 93, and does not have sub pixels. In the case that it is assumed that each of the first sub pixels 33

(r, g, b) which configure the first pixels 31 is one pixel, the ratio of the number of pixels for displaying an image in the first surface 3 to the number of pixels for displaying an image in the second surface 4 is 3-to-1 and not 1-to-1. The arrangement of the pixels (31, 32) and the like in the display region 100 and the configuration of the second pixels 32 are also similar to the arrangement in the organic EL device 93. That is, the first pixels 31, the second pixels 32 and each of the first sub pixels 33 (r, g, b) which configure the first pixels 31 are formed in columns shown in FIG. 2A described above.

FIG. 11 is a schematic cross-sectional diagram of the display region 100 of the organic EL device 94 relating to the fourth embodiment. As shown in the diagram, the cross-sectional configuration of the first pixel region 41 and the cross-sectional configuration of the transmissive region 43 are the same as the cross-sectional configurations of the organic EL device 93 shown in FIG. 9. The second pixels 32 formed in the second pixel region 42 are also a combination of the organic EL element 29, the TFT 112, the holding capacitor which is not shown, and the like. This is the same as the second pixels 32 of the organic EL device 93. However, compared to the second pixel 32 of the other embodiments, the second pixel electrode 36 is formed slightly larger. As a result, the ratio of the first pixel region 41 to the second pixel region 42 is secured as approximately 3-to-2 and not 3-to-1 which is the ratio of the number of pixels described above. Due to this configuration, the organic EL device 94 of the embodiment displays color images in the first surface 3 and displays black and white images, which have low pixel density compared to the color images described above, in the second surface 4.

Also in regard to the organic EL device 94 relating to the embodiment, it is preferable to suppress the irradiating of display light (5, 6) to the opposite side and the reflecting of external light 7 in the same manner as the organic EL devices (91, 92, 93) of the embodiments described above. To that end, in the same manner as the organic EL devices (91, 92, 93) of the embodiments described above, it is also preferable that the pixel electrodes (35, 36) are formed to be included inside of the reflecting layers (13, 14) in a plan view, that the partition, which is formed of an insulating material with light blocking properties so as to surround the pixel electrodes (35, 36) in a plan view, is formed between the pixel electrodes (35, 36) and the light emitting functional layer 15, and further that the light blocking layer is formed on a specific region of both rear surfaces of the substrates (10, 11), that is, the surfaces on the opposite side to the sealing layer 79 side.

Effects of the Embodiment

As described above, the organic EL device 94 of the embodiment realizes a double-sided display organic EL device which displays color images on only one surface, and displays black and white images on the other surface in the same manner as the organic EL device 93 of the third embodiment. As described above, the organic EL device with this configuration can be realized by addition of a slight cost to a typical organic EL device which displays color images on only one surface. In addition, the organic EL device 94 of the embodiment can realize display of black and white images at a lower cost in exchange for a slight reduction in image quality. Accordingly, while increases in manufacturing costs are further suppressed, a double-sided display organic EL device can be realized which is appropriate in cases where it is permissible that there is a further difference in image quality between images displayed on one surface (the first surface 3) and images displayed on another surface (the second surface 4).

The configurations of the embodiments of the invention are not limited to the embodiments described above, and various modifications and alternations can be made. Modified examples are described below.

Modified Example 1

In regard to the embodiments described above, the organic EL layer included in the light emitting functional layer is an organic EL layer that irradiates white light. The display of color images is performed in each sub pixel by emphasizing light with a specific wavelength range in light included in the white light. However, as an embodiment of the invention, a configuration is also possible where organic EL layers are individually formed to match the color of the display light irradiated by each of the sub pixels. According to this configuration, the color filter or the resonator structure can be omitted. Here, the individual organic EL layers can be formed by an ink injection method or a mask film formation method.

Modified Example 2

The organic EL devices of the embodiments described above (except for the first embodiment) combines use of the color filter and the resonator structure in order to emphasize light with a specific wavelength range. However, the emphasizing described above is possible with only either of the color filter or the resonator structure. In addition, the configuration may be changed by the first pixels 31 and the second pixels 32. In particular, as forming the color filter on the element substrate 10 side increases the cost, manufacturing costs can be suppressed in exchange for a slight reduction in image quality if there is a configuration where the second pixels 32 which irradiate light to the second surface 4 output colored light by using only the resonator structure.

Modified Example 3

In the embodiments described above, the organic EL devices 91 to 94 are described as an active matrix type, but may be a passive (simple) matrix type where the light emitting functional layer is interposed between the scanning electrode and the data electrode. Even in this configuration, by forming reflecting layers (13, 14) on both sides of the light emitting functional layer 15, double-sided display is possible using a single light emitting functional layer.

The entire disclosure of Japanese Patent Application No. 2009-287303, filed Dec. 18, 2009 is expressly incorporated by reference herein.

What is claimed is:
1. A display device comprising:
a first substrate;
a second substrate;
a light emitting functional layer which is disposed between the first substrate and the second substrate;
a first pixel which emits light to the second substrate side and is disposed above the first substrate, the first pixel having a first pixel electrode disposed between the light emitting functional layer and the first substrate, a second electrode disposed between the light emitting functional layer and the second substrate, and a first reflecting layer disposed between the first pixel electrode and the first substrate;

a second pixel which emits light to the first substrate side and is disposed above the first substrate, the second pixel having a second pixel electrode disposed between the light emitting functional layer and the first substrate, the second electrode disposed between the light emitting functional layer and the second substrate, and a second reflecting layer disposed between the second electrode and the second substrate;

a transmissive region that transmits light through the first substrate and the second substrate, the transmissive region being positioned between the first pixel and the second pixel in a plan view; and a partition layer formed in a region surrounding the first pixel electrode and the second pixel electrode in a plan view, the partition layer not overlapping at least a part of the transmissive region.

2. The display device according to claim 1, wherein the transmissive region is a region where both the first pixel electrode and the second pixel electrode are not disposed.

3. The display device according to claim 1, wherein the second electrode and the light emitting functional layer of the first pixel are in the same layer as the second electrode and the light emitting functional layer of the second pixel.

4. The display device according to claim 1, wherein at least one of the two types of pixel electrodes of the first pixel electrode and the second pixel electrode has three types of a sub pixel electrode of a red sub pixel electrode, a green sub pixel electrode and a blue sub pixel electrode which are each driven independently, and a pixel region which corresponds to the at least one of the two types of pixel electrodes is partitioned into three types of sub pixel regions, a red sub pixel region which includes the red sub pixel electrode in a plan view and emits red light, a green sub pixel region which includes the green sub pixel electrode in a plan view and emits green light, and a blue sub pixel region which includes the blue sub pixel electrode in a plan view and emits blue light.

5. The display device according to claim 4, wherein on a side opposite to the reflecting layer side of the light emitting functional layer in the three types of sub pixel regions, a color filter is formed corresponding to a color of light irradiated from each of the sub pixel regions.

6. The display device according to claim 4, wherein the three types of sub pixel electrodes include a semi-transmissive reflecting layer on a side opposite to the reflecting layer of the light emitting functional layer, and an optical resonator structure, which optically resonates light with a specific wavelength range, is formed between the semi-transmissive reflecting layer and the reflecting layer.

7. The display device according to claim 1, wherein at least one of the first pixel electrode and the second pixel electrode is provided in a zigzag shape.

8. The display device according to claim 1, wherein at least one of the first pixel electrode and the second pixel electrode is provided in a column shape.

9. The display device according to claim 1, wherein the transmissive region further includes a conductive film that is formed of a transmissive material, the conductive film electrically isolated from the first pixel electrode and the second pixel electrode.

10. The display device according to claim 1, further comprising a first driving element which electrically connects to the first pixel electrode and a second driving element which electrically connects to the second pixel electrode.

11. The display device according to claim 1, wherein the second electrode extends through the transmissive region.

12. The display device according to claim 1, wherein the light emitting functional layer extends through the transmissive region.

* * * * *